United States Patent [19]

Haigh et al.

[11] 4,307,680
[45] Dec. 29, 1981

[54] GROWTH OF SEMICONDUCTOR COMPOUNDS

[75] Inventors: John Haigh, Ipswich; Marc M. Faktor, Bushey Heath; Rodney H. Moss, Felixstowe, all of England

[73] Assignee: Post Office, London, England

[21] Appl. No.: 18,056

[22] Filed: Mar. 6, 1979

[30] Foreign Application Priority Data

Mar. 7, 1978 [GB] United Kingdom ............... 9021/78

[51] Int. Cl.³ ..................... H01L 21/208; B05C 3/18
[52] U.S. Cl. .................................. 118/64; 118/412; 118/415
[58] Field of Search ............... 118/412, 719, 415, 620, 118/422, 733, 64, 724; 156/622; 148/171, 172

[56] References Cited

U.S. PATENT DOCUMENTS

| | | | |
|---|---|---|---|
| 3,491,720 | 1/1970 | Harris | 118/719 |
| 3,972,753 | 8/1976 | Legros et al. | 118/415 X |
| 4,028,146 | 6/1977 | Logan et al. | 148/171 |
| 4,075,043 | 2/1978 | Clarke et al. | 148/171 |
| 4,088,514 | 5/1978 | Hara et al. | 118/415 X |
| 4,137,865 | 2/1979 | Cho | 118/724 |

*Primary Examiner*—John P. McIntosh
*Attorney, Agent, or Firm*—Kemon & Estabrook

[57] ABSTRACT

Semiconductor compounds which are alloys of group III-V compounds are grown by a liquid phase epitaxy method which includes heating growth apparatus in a reducing atmosphere while maintaining a solvent for the compound, a source of the group III-V compound and another element of the alloy separate from each other. After heating to reduce oxides, the element is added to the solvent, the source is brought into contact with the solvent and the resulting solution is brought into contact with a substrate to effect growth of the compound. Apparatus for carrying out the method is also described.

8 Claims, 4 Drawing Figures

GROWTH OF SEMICONDUCTOR COMPOUNDS

DESCRIPTION

This invention relates to the growth of semiconductor compounds by liquid phase epitaxy. The invention relates particularly to the growth of binary and higher order compounds formed by elements in group III with elements in group V of the periodic table hereinafter referred to as group III–V compounds.

Liquid phase epitaxy is used to grow compounds such as gallium arsenide and gallium aluminium arsenide. In this method a liquid gallium solvent, in which is dissolved gallium arsenide or gallium aluminium arsenide, is placed in contact with a substrate on which a gallium arsenide or gallium aluminium arsenide layer is to be grown. The solution, which initially is at a temperature at which the compound to be grown is appreciably soluble in the solvent, is cooled. The cooling produces a supersaturation which results in a layer of gallium arsenide or gallium aluminium arsenide being grown on the substrate. The cooling can be carried out during the actual growth of the layer; alternatively the solution can be subjected to a single rapid cooling step prior to the solution being brought into contact with the substrate, the solution then being maintained at a constant uniform temperature throughout the growth of the layer.

Apparatus for growing semiconductor compounds by this method generally comprises a solution holder in the form of a boat or slider which is generally made of graphite. The slider is arranged to be slidably mounted on a base in which is provided a recess for receiving the substrate on which the compounds are to be grown. The slider generally has a plurality of bottomless wells formed therein, the wells being spaced axially along the slider. In use of the apparatus the slider is placed on the base so that it is spaced from the substrate. Appropriate solutions are placed in the wells and saturation slices of the compound or components of the compound to be grown are placed on the solution. If necessary a lid or the like can be placed on the slider in order to press down on the top of each saturation slice. The apparatus is placed in a furnace and heated to a predetermined temperature so that the solution is saturated with the material of the slice. A controlled cooling step as described above is then provided in order to cause a supersaturation of the solution and hence growth of the compound on the substrate. Successive layers of different semiconductor compounds can be grown by periodically moving the slider along the base and carrying out the growth procedure each time one of the wells is above the substrate.

It has been found that oxides form on the solutions in the wells and these oxides are undesirable for several reasons. The most pernicious oxide, and the only one which once formed cannot be removed by heat treatment, is that of aluminium. Aluminium oxide is formed when gallium aluminium arsenide is being grown.

We have found that the formation of aluminium oxide can be reduced to acceptable proportions by initially locating the substrate in the base and placing the appropriate solutions in the wells in the slider, but omitting the aluminium, and then heating the slider to the growth temperature. This procedure results in oxygen being driven off together with water and other oxides which could react with aluminium to yield the aluminium oxide. The boat is then cooled and removed to a chamber where the aluminium is added, all operations subsequent to the initial heating including the growth being carried out in a dry, oxygen-free atmosphere.

According to one aspect of the present invention there is provided a method of growing semiconductor compounds which are alloys of group III–V compounds by liquid phase epitaxy comprising heating the growth apparatus in a reducing atmosphere whilst maintaining a solvent for the compound, a source of the group III–V compound and the other element or elements of the alloy separate from each other, after said heating adding said element or elements to said solvent, bringing the source into contact with said solvent, and bringing the resulting solution into contact with a substrate to effect growth of the compound.

The source may be gallium arsenide and said element may be aluminium. The reducing atmosphere may be hydrogen.

With this method it is possible to keep separate the solvent, the saturation slice and other element of the alloy during initial heating to remove oxygen. It is thus possible to raise the initial heating temperature considerably above the normal growth temperature of the compound without the formation of pernicious oxides and this enables more efficient purging of oxygen to take place.

According to another aspect of the present invention there is provided apparatus for growing semiconductor compounds by liquid phase epitaxy comprising a sealable chamber having a growth region which can be heated to desired temperature and a loading region, passage means communicating with said loading region, and manipulation means operable from a position external to said chamber to allow manoeuvring of items in said chamber.

The chamber may be tubular and arranged with its axis substantially horizontal and said passage means comprises a generally upwardly extending portion which communicates with a transversely extending portion to define a T-shape, and said apparatus includes a rod extending into said transversely extending portion through a seal. The end of the rod may be hook-shaped.

The apparatus may include a boat which is slidable relative to a substrate carrier, said carrier having a recess for receiving a substrate on which a semiconductor compound is to be grown, and said boat having at least one well for receiving a suitable solvent which can be brought into contact with a substrate by relative sliding movement of the boat and carrier, said boat and carrier being arranged to be received in said chamber. The wall of the boat may be cut away to define an opening in communication with said well, said cut away portion defining a surface onto which a slice of semiconductor material can be placed, said surface being so disposed that during use of the apparatus a semiconductor slice can be moved from said surface onto the surface of a solvent in said well by operation of said manipulation means. The boat may be located in an elongate channel formed in a housing member, said boat having a plurality of axially spaced bottomless wells and said carrier being carried on or defined by the base of said channel, one upright wall of the housing having cut away portions corresponding to those in the boat.

The manipulation means may include a manipulator which is operable to move said boat and carrier between said loading and growth regions.

According to a further aspect of the present invention there is provided a boat and substrate carrier for use with the apparatus, said boat being slidable relative to said substrate carrier, said carrier having a recess for receiving a substrate on which a semiconductor compound is to be grown, said boat having at least one well for receiving a suitable solvent which can be brought into contact with a substrate by relative sliding movement of the boat and carrier, the wall of the boat being cut away to define an opening in communication with said well, said cut away portion defining a surface onto which a slice of semiconductor material can be placed, said surface being so disposed that during use a semiconductor slide can be moved from said surface onto the surface of a solvent in said well.

The invention will be described now by way of example only with particular reference to the accompanying drawings. In the drawings.

Figure 1:
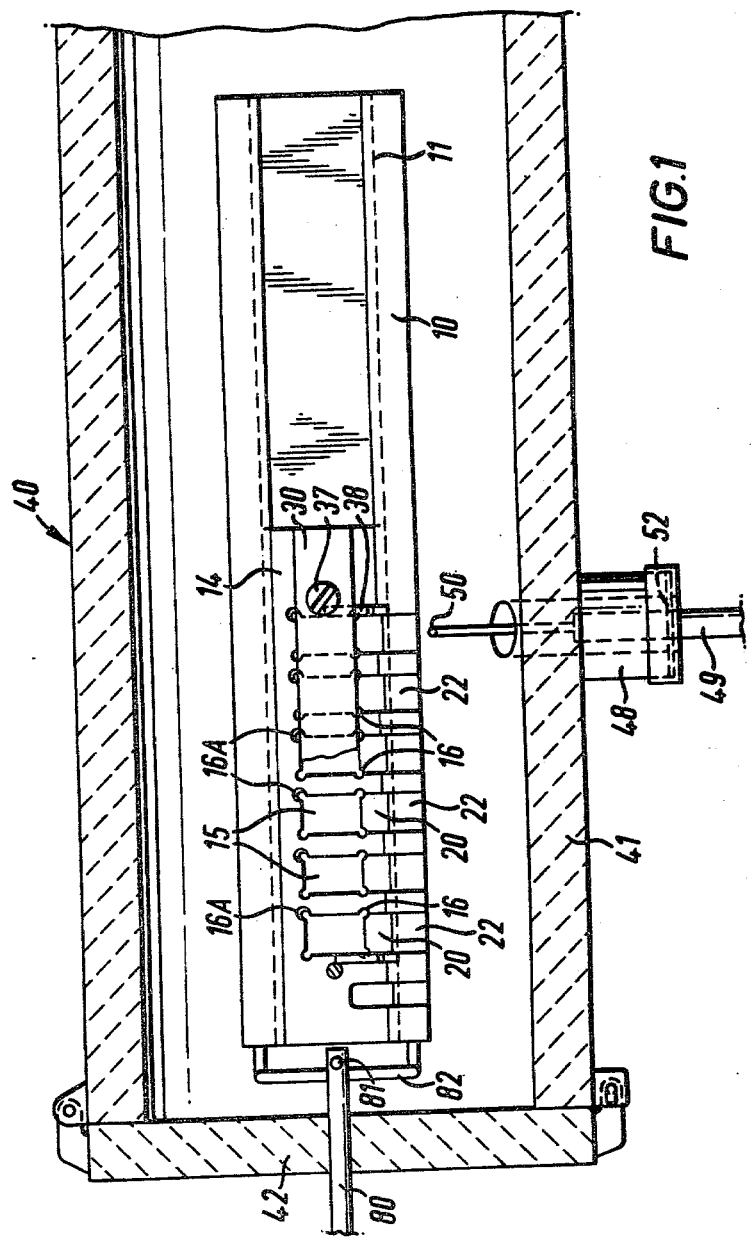
FIG. 1 is a plan view partly in section of apparatus in accordance with the present invention.
Figure 2:
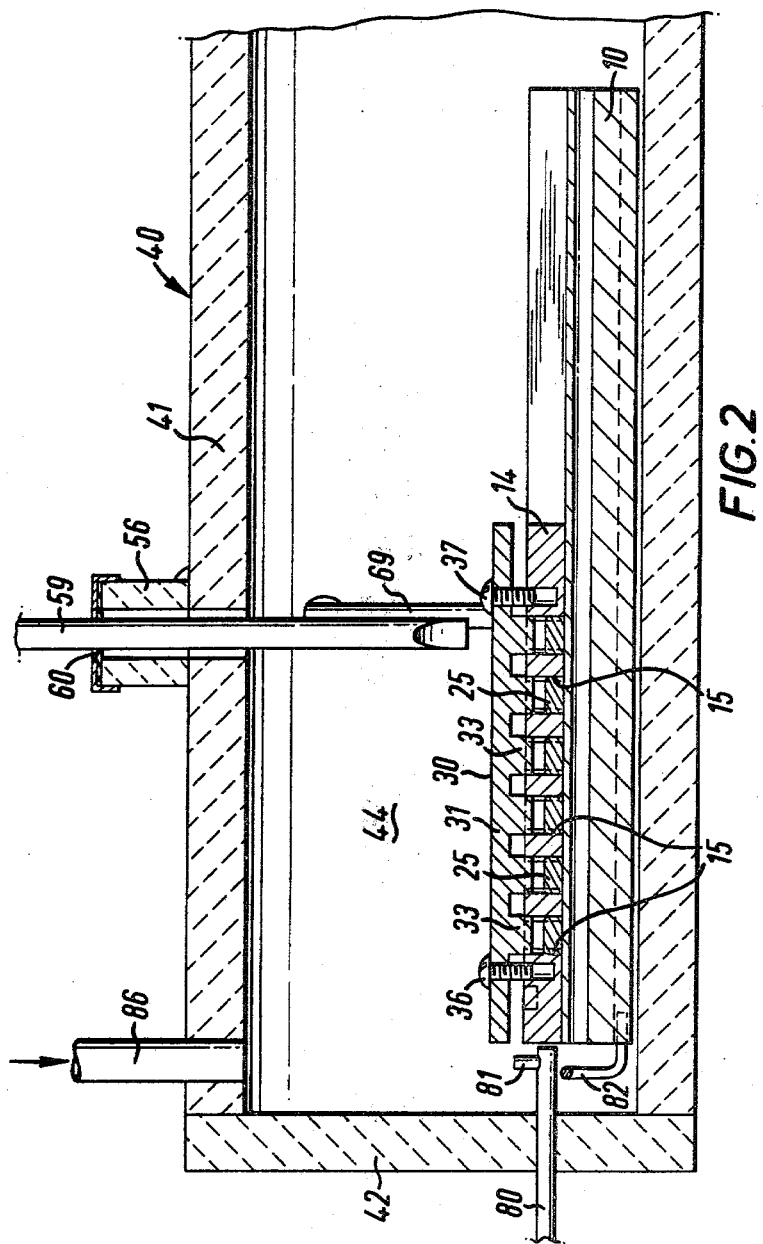
FIG. 2 is a side sectional view of the apparatus of FIG. 1.

Apparatus for growing gallium aluminium arsenide comprises an elongate graphite housing 10 which has a dovetail channel 11 formed therein. The base of the channel 11 is generally planar and has a recess therein for receiving a substrate of gallium arsenide. The recess is positioned near the centre of the channel and has a depth such that when a substrate is placed therein the upper surface of the substrate is substantially flush with the surface of the channel 11.

An elongate graphite boat or slider 14 is mounted in the housing 10 so that it sits on the channel 11. The slider 14 has an axial extent approximately half that of the axial extent of the housing 10. The slider has formed therein a plurality of bottomless wells 15, the wells 15 being spaced axially along the slider. Each well is generally rectangular the corners of the rectangle being rounded as shown at 16. One of the rounded corners 16A is larger than the others and constitutes an entry chute for the well. The cross-sectional shape of slider 14 corresponds to that of the channel in the housing 10 so that the slider cannot be lifted from the channel 11.

At positions adjacent each well the wall of the housing 10 has a rectangular cut away portion 20 to provide a shelf portion 21. Similar cut away portions are provided at corresponding positions in the wall of the slider 14 and these are indicated at 22.

When the apparatus is being used to grow gallium arsenide or gallium aluminium arsenide, a liquid gallium solvent is placed in the first of the wells 15 and a gallium arsenide saturation slice is placed on the shelf 21 defined by the cut away portions 20 and 22. After suitable heating as will be described later the slice is pushed from the shelf 21 on to the surface of the liquid gallium. The liquid gallium is shown at 25 and the slice at 26. It will be seen that the shelf 21 provided by the cut away portions 20 and 22 is substantially at the same level as the top of the liquid gallium 25. Generally a lid is provided with the slider 14 and is illustrated at 30. The lid comprises an upper rectangular section 31 from which depend legs of a rectangular cross-section 33. Each leg corresponds substantially in cross-sectional shape to the cross-sectional shape of the wells 15 and is provided at a position where it can enter a well when the lid is placed on the slider. The lid is attached to the slider by means of screws 36, 37. A wedged shaped portion 38 is provided at one end of the lid for a purpose to be described later. The lid is used to press down on top of the saturation slice to force the liquid gallium solvent into intimate contact with the base plate 12. The rounded corners of each well facilitate penetration of the gallium into the corners.

The apparatus described above is located within a furnace 40. The furnace 40 comprises a generally tubular silica housing 41 which has a removable end plate 42. The furnace defines a sealed chamber comprising two main regions, a loading region 44 and a growth region 45. The growth region can be heated to preselected temperatures by heating elements. The loading region is not heatable.

The loading region has a first generally horizontally extending passage 48 communicating therewith. The passage 48 accommodates a probe 49 with a hooked end 50, the probe being sealed within the passage 48 by a seal 52 which can be a modified PTFE (Swagelock) seal. The probe 49 can be moved axially and rotatably within the passage 48 so that it can be used to push slices 26 from their positions on the shelves 21. Also the probe 49 can be used to move the wedges 38 from under the lid 30.

The loading region also has generally upwardly extending passages 56, 57. The passage 56 accommodates a screwdriver 59 which is sealed within the passage by a Swagelock seal 60 so that the screwdriver is movable axially and rotatably in the passage 56.

The passage 57 accommodates a generally T-shaped pipette 65 which is sealed therein by a Swagelock seal 66. The lower end 68 of the generally upwardly extending leg 69 of the pipette is shaped so that it can emerge with the rounded corner 16A of one of the wells 15. A rod 71 with a hook shaped end 72 extends axially into the transversely extending section 73 of the pipette 65 through a seal 74. The rod 71 can be moved axially through the seal. In use the transversely extending section 73 accommodates aluminium particles 76 which can be moved so they drop into the loading chamber 44 by manipulation of the rod 71.

The pipette 65, rod 71, screwdriver 59 and probe 49 are all made of silica. The seals 52, 60, 74 prevent air from entering the furnace chamber.

Figure 4:
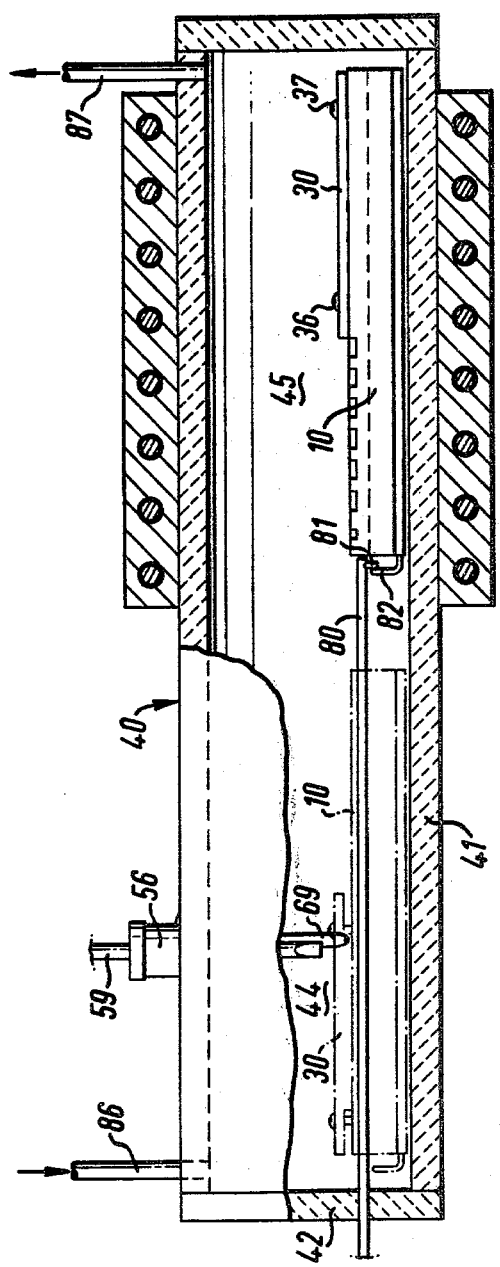
FIG. 4 illustrates the operation of the apparatus.

The end plate 42 carries a silica rod 80 which is mounted on the plate so that it can slide through a seal (not shown). The rod 80 has a laterally extending pin 81 on its end within the loading chamber. The rod 80 can be used to push the boat to the right as shown in FIG. 4 or pull it to the left by engaging the pin 81 with a silica strap 82 linked to the housing 10. Thus the rod can be used to change the position of the boat within the furnace chamber. The rod 80 can also be used to adjust the position of the slider 14 on the housing 10.

The operation of the apparatus will now be described with reference to the growth of gallium aluminium arsenide. The slider 14 is placed on to the housing 10 and liquid gallium is placed in one of the wells 15. A gallium arsenide slice 26 is placed on to the shelf 21 and the lid 30 is placed over the wells. The wedge 38 is placed under one end of the lid so that the legs 33 which depend from the lid section 31 are clear of the surface of the liquid gallium. The apparatus is then placed in the loading chamber 44 of the furnace and then is pushed using the rod 80 into the main furnace chamber 45. Pure dry hydrogen is then flushed through the furnace by way of ports 86, 87. Hydrogen is used because it can be obtained freer of oxygen and water more readily than any other gas. The aluminium pellets are in the pipette 65. Also the slider 14 is positioned such that the liquid gallium is not in contact with a gallium arsenide substrate in the recess in the housing 10.

Figure 3:
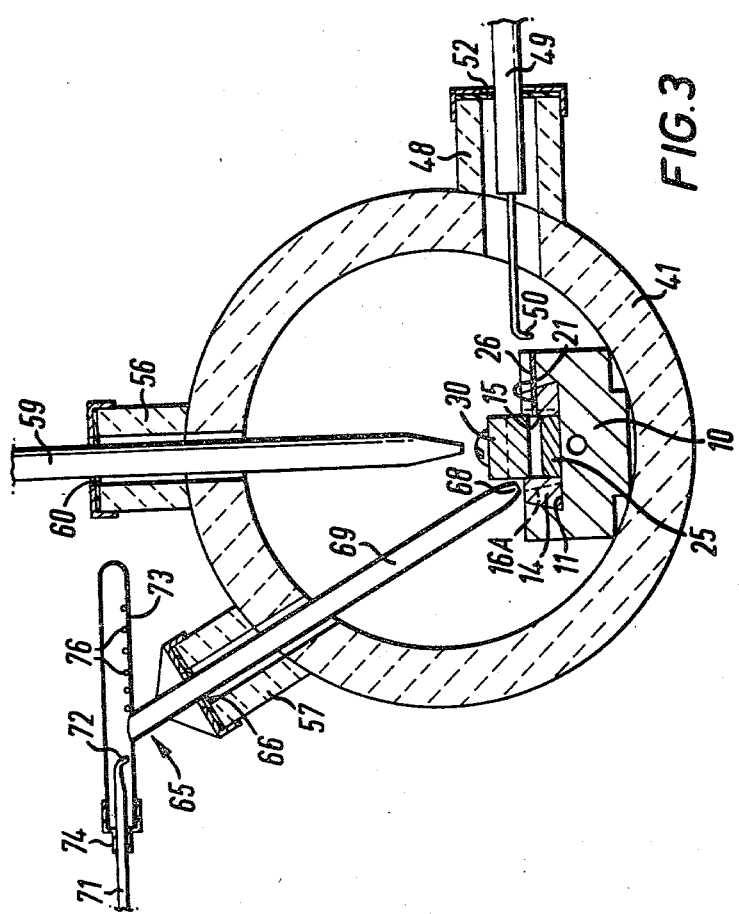
FIG. 3 is an end view in section of the apparatus of FIG. 1.

The growth region 45 of the furnace is then heated to and held at a temperature in the range 700° C. to 1200° C. (growth temperature of gallium arsenide is 840° C.). The furnace is maintained at this temperature until it is considered that all the oxygen and water have been purged from the furnace. The aluminium pellets are maintained in the cooler part of the furnace and do not form pernicious oxides. The arrangement is then cooled to room temperature and the boat withdrawn to the loading section 44. The rod 71 is manipulated to drag aluminium pellets from their position shown in FIG. 3 so that they drop into the well containing the liquid gallium by way of the pipette section 69 and the chute 16A.

The housing 10 and the slider 14 thereon are then pushed back into the growth region 45 of the furnace and the growth process is carried out as described for example in U.K. Pat. No. 1,536,906.

It will be appreciated that if several layers are being grown on a substrate other solvents will be located in the other wells in the slider 14. Several growth processes can be carried out with the slider being pushed forward between each growth so that successive wells are located over the substrate.

It will be noted that during the initial reducing stage the liquid gallium 25 and gallium arsenide slice 26 are separate from each other. Additionally the aluminium is maintained in a relatively cool part of the furnace chamber thereby reducing the likelihood of the formation of pernicious oxides of aluminium.

As an alternative to the T-shaped pipette 65 a single upwardly extending tube with a removable cap may be employed. The cap is removed temporarily when the aluminium is added.

We claim:

1. Apparatus for growing semi-conductor compounds which are alloys of group III–V compounds by liquid phase epitaxy comprising a unitary sealable chamber having a loading region and a growth region, heating means associated with said growth region for heating same to a desired temperature, said loading region communicating with a compartment externally of said chamber, said compartment housing an oxidizable component of the compound to be grown, seal means provided on said compartment; manipulating means extended into said compartment through said seal means; a substrate carrier and growth boat located in said chamber, and manipulation means carried by said chamber and operable externally thereof for moving said carrier and boat between the two regions.

2. Apparatus for growing semi-conductor compounds as claimed in claim 1 wherein said compartment is mounted upon the end of a tube extending in to said chamber in the loading region, and said manipulating means includes a rod extending through said seal into said compartment.

3. Apparatus for growing semiconductor compounds as claimed in claim 2 wherein the end of the rod is hook-shaped.

4. Apparatus for growing semiconductor compounds as claimed in claim 1 wherein said boat is slidable relative to said substrate carrier, said carrier having a surface for receiving a substrate on which a semiconductor compound is to be grown, and said boat having at least one well for receiving a suitable solvent which can be brought into contact with a substrate by relative sliding movement of the boat and carrier.

5. Apparatus for growing semi-conductor compounds as claimed in claim 4 wherein the wall of said boat is cut away to define an opening in communication with said well, said cut away portion defining a surface onto which a slice of semi-conductor material can be placed, a second manipulating means carried by said chamber within said loading region for engaging a semiconductor slice on said surface for moving said slice onto the upper surface of said solvent in said well.

6. Apparatus for growing semiconductor compounds as claimed in claim 5 wherein said chamber is provided with a housing member having an elongate channel for supporting said boat, said boat having a plurality of axially spaced bottomless wells and said carrier being carried on or defined by the base of said channel, said housing member having one upright wall provided with cut away portions corresponding to those in the boat.

7. In an apparatus for growing semi-conductor compounds by liquid phase epitaxy which apparatus includes a chamber having a loading region and a growth region, said growth region having a boat and a substrate carrier, said boat being slidable in said growth region relative to said substrate carrier, said carrier having a surface for receiving a substrate on which a semi-conductor compound is to be grown, said boat having at least one well for receiving a suitable solvent which can be brought into contact with a substrate by relative sliding movement of the boat and carrier, a lateral upright wall of the boat being cut away to define an opening in communication with said well, said cut away portion defining a surface onto which a slice of semiconductor material can be placed, said surface being so disposed that during use a semi-conductor slice can be moved from said surface from said surface onto the surface of a solvent in said well.

8. In an apparatus for growing semi-conductor compounds as set forth in claim 7 wherein said growth region is provided with a housing member having an elongated channel for receiving said boat, said boat having a plurality of axially spaced bottomless wells, said substrate carrier being positioned upon said channel, said housing having an upright wall with a portion thereof cut away corresponding to the cut away portion of said boat.

* * * * *